(12) United States Patent
Zhang

(10) Patent No.: US 11,444,064 B2
(45) Date of Patent: Sep. 13, 2022

(54) METHOD OF FORMING MESH PLATE AND DISPLAY DEVICE CONTAINING THE MESH PLATE

(71) Applicant: Wuhan China Star Optoelectronics Technology Co., Ltd., Wuhan (CN)

(72) Inventor: Guiyang Zhang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 141 days.

(21) Appl. No.: 16/620,898

(22) PCT Filed: Apr. 24, 2019

(86) PCT No.: PCT/CN2019/084084
§ 371 (c)(1),
(2) Date: Dec. 10, 2019

(87) PCT Pub. No.: WO2020/107787
PCT Pub. Date: Jun. 4, 2020

(65) Prior Publication Data
US 2021/0296290 A1    Sep. 23, 2021

(30) Foreign Application Priority Data
Nov. 28, 2018   (CN) .......................... 201811437607.0

(51) Int. Cl.
*H01L 25/075*   (2006.01)
*H01L 33/00*    (2010.01)
*H01L 33/62*    (2010.01)

(52) U.S. Cl.
CPC ........ *H01L 25/0753* (2013.01); *H01L 33/005* (2013.01); *H01L 33/62* (2013.01); *H01L 2933/0066* (2013.01)

(58) Field of Classification Search
CPC combination set(s) only.
See application file for complete search history.

(56) References Cited

U.S. PATENT DOCUMENTS

| | | |
|---|---|---|
| 2017/0170360 A1 | 6/2017 | Bour et al. |
| 2019/0115233 A1* | 4/2019 | Chen .................... H01L 25/0753 |
| 2021/0020612 A1* | 1/2021 | Yoo ......................... G03B 15/05 |

FOREIGN PATENT DOCUMENTS

| | | |
|---|---|---|
| CN | 200983722 | 11/2007 |
| CN | 108365081 | 8/2018 |
| CN | 109599477 | 4/2019 |

* cited by examiner

*Primary Examiner* — Ratisha Mehta

(57) ABSTRACT

A method of forming a mesh plate and a display device containing the mesh plate are provided. The mesh plate includes a plurality of first portions extend in a horizontal direction and parallel to each other and a plurality of second portions extend in a vertical direction and parallel to each other. Material of each of the first portions and the second portions is independently selected from one of magnet and magnetically conductive material. The positions of the first portions and the second portions is adjusted to cross each other and thus form a plurality of open areas according to preset positions for the open areas.

14 Claims, 3 Drawing Sheets

Providing a plurality of first portions extending in a horizontal direction and being parallel to each other, and a plurality of second portions extending in a vertical direction and being parallel to each other. Material of each of the first portions and the second portions is independently selected from one of a magnet and magnetically conductive material. ⟋S1

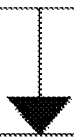

Adjusting positions of the first portions and the second portions to cross each other and thus form a plurality of open areas according to preset positions for the open areas. ⟋S2

FIG. 1

METHOD OF FORMING MESH PLATE AND DISPLAY DEVICE CONTAINING THE MESH PLATE

RELATED APPLICATIONS

This application is a National Phase of PCT Patent Application No. PCT/CN2019/084084 having International filing date of Apr. 24, 2019, which claims the benefit of priority of Chinese Patent Application No. 201811437607.0 filed on Nov. 28, 2018. The contents of the above applications are all incorporated by reference as if fully set forth herein in their entirety.

FIELD AND BACKGROUND OF THE INVENTION

The present disclosure relates to a field of display technologies, and more particularly to a method of forming a mesh plate.

Currently, thin-film transistors (TFTs) are main driving components in liquid crystal displays (LCDs) and active-matrix organic light-emitting diodes (AMOLEDs). Thin-film transistors directly associate with display performance of flat-panel display devices.

Most of the liquid crystal displays in current market are backlight-type liquid crystal displays having liquid crystal display panels and backlight modules. Working principle of the liquid crystal display panels is as follow: liquid crystal molecules are filled between a thin-film transistor array substrate (TFT array substrate) and a color filter (CF) substrate. Pixel voltages and common voltages are applied on both of the TFT array substrate and the CF substrate. Rotation directions of the liquid crystal molecules is controlled by an electric field formed between the pixel voltage and the common voltage so as to transmit light of the backlight module and generate a picture.

In most cases, backlight modules of the prior art are edge backlight modules. Linear light sources emitted by lateral light emitting diodes (LEDs) are converted into surface light sources through light guide plates and mesh dots of the light guide plates. After being subjected to treatment of light homogenization and brightened by the upper film layer, polarizers, liquid crystal layers, and color filters form a color display. Light coupling efficiency of the light guide plates is about 60%. Transmittance of the upper film layer and the polarizers together is about 40%. Transmittance of the color filter is about 30%. The total light transmittance is about 7.2% when the three elements are superimposed. At present, most liquid crystal displays which are based on the edge backlight modules do not even reach the value of 7.2%, which cause a series of problems to the display devices, such as poor endurance, rapid battery aging, long charging time, difficult to reduce weight and thickness. AMOLEDs employ small light-emitting molecules to display under current excitation. Due to limitations of material properties, brightness and reliability of AMOLEDs still have to be improved. Traditional inorganic LED displays employ large-size LEDs for display, which are limited by resolution. The traditional inorganic LED displays are mostly used for manufacturing billboards In order to solve dilemma encountered by liquid crystal displays and LED displays, concept of mini-LED displays and micro-LED displays have been proposed recently. Sizes of LEDs of the mini-LEDs are several hundred microns. The LEDs of the mini-LEDs are employed to manufacture direct-lit backlights. Sizes of LEDs of the micro-LEDs are tens of micrometers. The LEDs of the micro-LEDs are directly used as display pixels. Each of the micro-LEDs are driven by a driver matrix to display. Each display panel requires tens of thousands or even millions of LEDs. As limited by current technologies, equipment, and processes, the micro-LED displays need further development, but the mini-LED displays can directly employ traditional technologies and processing equipment for mass production. The mini-LED displays have been demonstrated in vehicles and other products. The current mini-LEDs and micro-LEDs have to fix the LEDs onto conductive substrates, which requires tooling processes to produce a mesh plate. Solder paste is then uniformly applied to corresponding window opening areas via the mesh plate in order to connect the LED to electrodes in a bottom layer and to fix LEDs. Cost of the tooling processes of the mesh plate is often expensive and time consuming. Each LED arrangement corresponds to a mesh plate design. The LED arrangement and the mesh plate design are in a "one-to-one" relationship. The design cannot be changed once the tooling processes is completed, and thus, has a low applicability.

SUMMARY OF THE INVENTION

An object of the present disclosure is to provide a method of forming a mesh plate. The present method can dynamically adjust the position of open areas, thereby increasing applicability of the mesh plate and greatly reducing production cost.

In order to achieve the above object, the present disclosure provides a method of forming a mesh plate, comprising steps of:

a step S1 of providing a plurality of first portions extending in a horizontal direction and being parallel to each other, and a plurality of second portions extending in a vertical direction and being parallel to each other; wherein material of each of the first portions and the second portions is independently selected from one of a magnet and magnetically conductive material; and a step S2 of adjusting positions of the first portions and the second portions to cross each other and thus form a plurality of open areas according to preset positions for the open areas.

When at least one of the first portions and the second portions is a magnet, the step S2 comprises fixedly connecting the first portions to the second portions by an attractive force between the magnet and magnetically conductive material or between the magnet and the magnet.

When the material of both the first portions and the second portions is the magnetically conductive material, the step S2 comprises providing an electromagnetic induction device that connects to at least one of the first portions and the second portions, wherein the first portions and the second portions are fixedly connected to each other by a magnetic force generated by at least one of the first portions and the second portions via the electromagnetic induction device.

The electromagnetic induction device is an electromagnetic induction coil.

The step S2 comprises providing a frame, wherein both the first portions and the second portions are located in the frame and are slidably connected to the frame, such that the positions of the first portions and the second portions are adjusted by sliding the first portions and the second portions on the frame When at least one of the first portions and the second portions is a magnet, the first portions and the second portions are fixedly connected to each other by an attractive force between the magnet and the magnetically conductive material or between the magnet and the magnet.

When the material of both the first portions and the second portions is the magnetically conductive material, the frame generates electromagnetic induction such that both the first portions and the second portions generate a magnetic force to fixedly connect the first portions to the second portions.

The second portions are positioned above the first portions, and the second portions is provided with grooves that are defined at points where the second portions and the first portions are overlapped, such that bottom surfaces of the second portions and the first portions are flush on a same plane.

Thicknesses of the second portions are greater than thicknesses of the first portions.

Shapes of the first portions and the second portions are one of an elongated shape, a zigzag shape, a wave shape, and a square-wave shape; and shapes of the open areas are one of a rectangle, a diamond, and a circle.

Beneficial effects of present disclosure: the method of forming the mesh plate of the present disclosure uses a plurality of first portions extend in a horizontal direction and parallel to each other and a plurality of second portions extend in a vertical direction and parallel to each other. Material of each of the first portions and the second portions is independently selected from one of a magnet and magnetically conductive material. The positions of the first portions and the second portions is adjusted to cross each other and thus form a plurality of open areas according to preset positions for the open areas, so that dynamical adjustment of the positions of the open areas is achieved by the method of forming the mesh plate. One mesh plate corresponds to a plurality of LED arrangement modes, i.e., meshes of the mesh plate and the LED arrangement are in a "one-to-many" relationship. Applicability of the mesh plate is increased and production cost is greatly reduced. No waste and exhaust gas are produced in the manufacturing process which possesses energy-saving and environmentally-friendly features.

BRIEF DESCRIPTION OF THE SEVERAL VIEWS OF THE DRAWINGS DRAWINGS

In order to further understand features and technical schemes of the present disclosure, please refer to the detailed description of the present disclosure and the accompanying drawings. However, the accompanying drawings provided herein are only used as reference and description. The accompanying drawings should not be construed as a limitation on the scope of the present disclosure.

In the drawings,

FIG. 1 is a flowchart of a method of forming a mesh plate of the present disclosure.

DESCRIPTION OF SPECIFIC EMBODIMENTS OF THE INVENTION

For further explaining the technical solutions and the effects of the present disclosure, the embodiments of the present disclosure will be further described in combination with the accompanying drawings of the present disclosure in follows.

Please refer to FIG. 1, the present disclosure provides a method of forming a mesh plate, comprising steps of:

a step S1 of providing a plurality of first portions 10 extending in a horizontal direction and being parallel to each other, and a plurality of second portions 20 extending in a vertical direction and being parallel to each other; wherein material of each of the first portions 10 and the second portions 20 is independently selected from one of a magnet and magnetically conductive material; and a step S2 of adjusting positions of the first portions 10 and the second portions 20 to cross each other and thus form a plurality of open areas 30 according to preset positions for the open areas.

It is noted that the present disclosure uses the first portions 10 and the second portions 20 which are selected from one of a magnet and a magnetically conductive material. Magnetic forces between the first portions 10 and the second portions 20 are attracted to each other. Therefore, the positions of the first portions 10 and the second portions 20 is adjusted to cross each other and form a plurality of open areas 30 according to preset positions for the open areas, so that dynamical adjustment of the positions of the open areas is achieved by the method of forming the mesh plate. One mesh plate corresponds to a plurality of LED arrangement modes, i.e., meshes of the mesh plate and the LED arrangement are in a "one-to-many" relationship. Applicability of the mesh plate is increased and production cost is greatly reduced. Furthermore, no waste and exhaust gas are produced in the manufacturing process which possesses energy-saving and environmentally-friendly features.

Specifically, in the process of manufacturing mini-LEDs and micro-LEDs, the mesh plate of the present disclosure is aligned with the driving substrate and the LED array is formed by solder paste coating and die bonding.

Specifically, the magnetically conductive material is selected from a combination of one or more of iron, cobalt, nickel, ferrite, neodymium iron boron, silicon steel, and chrome steel. The magnet is a permanent magnet.

Figure 2:
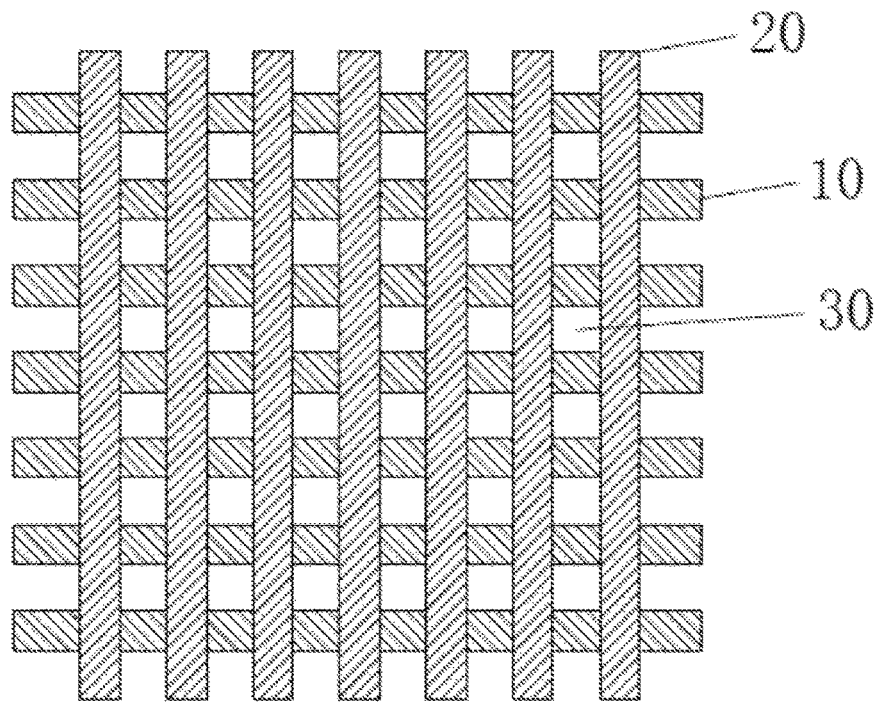
FIG. 2 is a schematic view of a method of forming a mesh plate according to a first embodiment of the present disclosure.

Specifically, please refer to FIG. 2, in the method of forming a mesh plate according to the first embodiment of the present disclosure, when at least one of the first portions 10 and the second portions 20 is a magnet, in the step S2, fixedly connecting the first portions 10 to the second portions 20 by an attraction force between the magnet and the magnetically conductive material, or between the magnet and the magnet.

Figure 3:
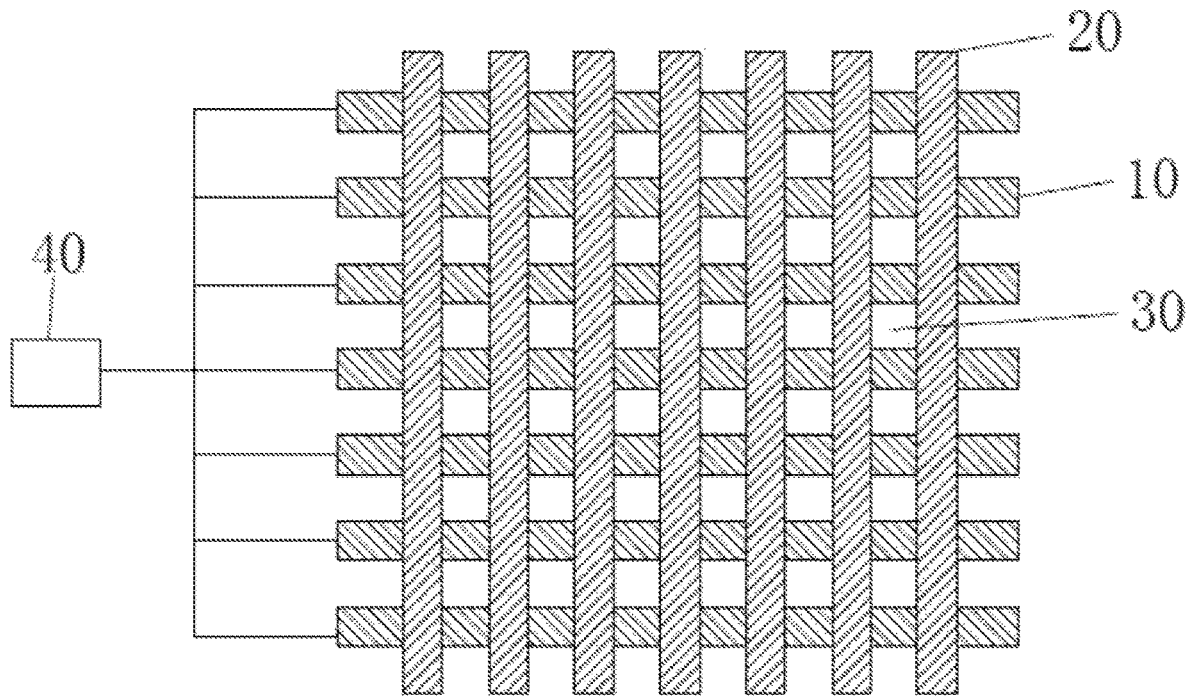
FIG. 3 is a schematic view of a method of forming a mesh plate according to a second embodiment of the present disclosure.

Specifically, please refer to FIG. 3, in the method of forming the mesh plate according to the second embodiment of the present disclosure, when the material of both the first portions 10 and the second portions 20 is both magnetically conductive material, in the step S2, providing an electromagnetic induction device 40 connected to at least one of the first portions 10 and the second portions 20. By the electromagnetic induction device 40, at least one of the first portions 10 and the second portions 20 generates a magnetic force so as to fixedly connect the first portions 10 to the second portions 20.

Furthermore, the electromagnetic induction device 40 is an electromagnetic induction coil. The electromagnetic induction device 40 can also be other devices that can generate electromagnetic induction. The present disclosure is not limited thereto.

Figure 4:
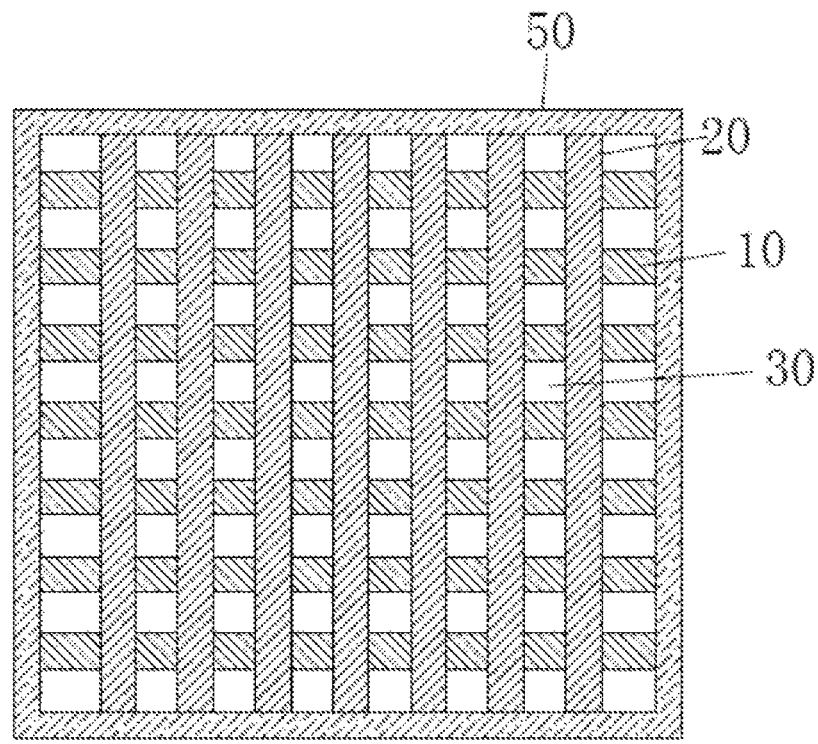
FIG. 4 is a schematic view of a method of forming a mesh plate according to a third embodiment of the present disclosure.

Specifically, please refer to FIG. 4, in the method of forming a mesh plate according to the third embodiment of the present disclosure, in the step S2, providing a frame 50. The first portions 10 and the second portions 20 are both located in the frame 50 and slidably connected to the frame 50. By sliding the first portions 10 and the second portions 20 on the frame 50, the positions of the first portions 10 and the second portions 20 are adjusted.

Furthermore, when at least one of the first portions 10 and the second portions 20 is a magnet, the first portions 10 and the second portions 20 are fixedly connected by an attractive force between a magnet and a magnetically conductive material, or between a magnet and another magnet.

Furthermore, when the material of both the first portions 10 and the second portions 20 is magnetically conductive material, the frame 50 generates electromagnetic induction so that both of the first portions 10 and the second portions 20 generate magnetic force, thereby fixedly connecting the first portions 10 to the second portions 20.

Figure 5:
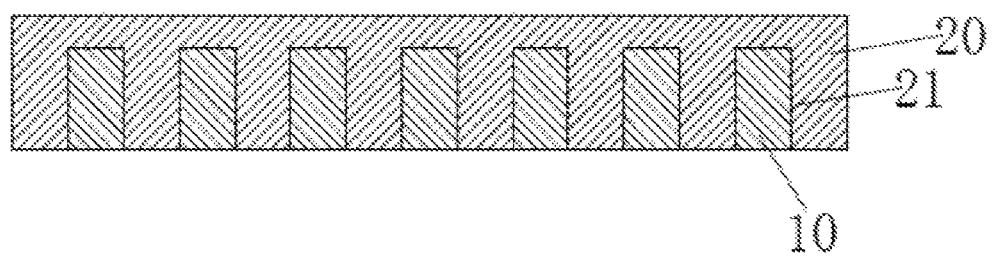
FIG. 5 is a schematic view of second portions overlapping first portions according to the method of forming the mesh plate of the present disclosure.

Specifically, please refer to FIG. 5, the second portions 20 are located above the first portions 10. The second portions 20 is provided with grooves 21 that are defined at points where the second portions 20 and the first portions 10 are overlapped, such that bottom surfaces of the second portions 20 and the first portions 10 are flush on a same plane.

Specifically, thicknesses of the second portion 20 are greater than thicknesses of the first portions 10.

Specifically, shapes of the first portions 10 and the second portions 20 are one of an elongated shape, a zigzag shape, a wave shape, and a square waveform.

Furthermore, shape of the open areas 30 is one of a rectangular shape, a rectangle, a diamond, and a circle, based on a combination of the shapes of the first portions 10 and the second portions 20. The shapes of the first portions 10, the second portions 20, and the opening portions 30 can be adjusted according to actual demand. The present disclosure is not limited thereto.

In summary, the method of forming the mesh plate of the present disclosure uses a plurality of first portions extend in a horizontal direction and parallel to each other and a plurality of second portions extend in a vertical direction and parallel to each other. Material of each of the first portions and the second portions is independently selected from one of a magnet and magnetically conductive material. The positions of the first portions and the second portions is adjusted to cross each other and thus form a plurality of open areas according to preset positions for the open areas, so that dynamical adjustment of the positions of the open areas is achieved by the method of forming the mesh plate. One mesh plate corresponds to a plurality of LED arrangement modes, i.e., meshes of the mesh plate and the LED arrangement are in a "one-to-many" relationship. Applicability of the mesh plate is increased and production cost is greatly reduced. No waste and exhaust gas are produced in the manufacturing process which possesses energy-saving and environmentally-friendly features.

Accordingly, a person skilled in the art may make various changes and modifications according to the technical schemes and technical concepts of the present disclosure. All such changes and modifications shall also fall within the scope of the claims of the present disclosure.

What is claimed is:

1. A method of forming a mesh plate, comprising steps of:
a step S1 of providing a plurality of first portions extending in a horizontal direction and being parallel to each other, and a plurality of second portions extending in a vertical direction and being parallel to each other; wherein material of each of the first portions and the second portions is independently selected from the group consisting of a magnet and magnetically conductive material; and
a step S2 of adjusting positions of the first portions and the second portions to cross each other and thus form a plurality of open areas according to preset positions for the open areas,
wherein when at least one of the first portions and the second portions is a magnet, the step S2 comprises fixedly connecting the first portions to the second portions by an attractive force between the magnet and magnetically conductive material or between the magnet and the magnet.

2. The method of forming the mesh plate according to claim 1, wherein the step S2 comprises providing a frame, wherein both the first portions and the second portions are located in the frame and are slidably connected to the frame, such that the positions of the first portions and the second portions are adjusted by sliding the first portions and the second portions on the frame.

3. The method of forming the mesh plate according to claim 2, wherein when at least one of the first portions and the second portions is a magnet, the first portions and the second portions are fixedly connected to each other by an attractive force between the magnet and the magnetically conductive material or between the magnet and the magnet.

4. The method of forming the mesh plate according to claim 2, wherein when the material of the first portions is the magnetically conductive material and the material of the second portions is the magnetically conductive material, the frame generates electromagnetic induction such that both the first portions and the second portions generate a magnetic force to fixedly connect the first portions to the second portions.

5. The method of forming the mesh plate according to claim 1, wherein the second portions are positioned above the first portions, and the second portions is provided with grooves that are defined at points where the second portions and the first portions are overlapped, such that bottom surfaces of the second portions and the first portions are flush on a same plane.

6. The method of forming the mesh plate according to claim 5, wherein thicknesses of the second portions are greater than thicknesses of the first portions.

7. The method of forming the mesh plate according to claim 1, wherein shapes of the first portions and the second portions are one of an elongated shape, a zigzag shape, a wave shape, and a square-wave shape; and shapes of the open areas are one of a rectangle, a diamond, and a circle.

8. A display device, comprising a mesh plate, wherein the mesh plate comprises:
a plurality of first portions extending in a horizontal direction and being parallel to each other; and
a plurality of second portions extending in a vertical direction and being parallel to each other;
wherein material of each of the first portions and the second portions is independently selected from the group consisting of a magnet and magnetically conductive material; and wherein positions of the first portions and the second portions are crossed with respect to each other to define a plurality of open areas, according to preset positions for the open areas, wherein when at least one of the first portions and the second portions is a magnet, the first portions are fixedly connected to the second portions by an attractive force between the magnet and magnetically conductive material or between the magnet and the magnet.

9. The display device according to claim 8, wherein the display device further comprises a frame, both the first portions and the second portions are located in the frame and are slidably connected to the frame, such that the positions of the first portions and the second portions are adjusted by sliding the first portions and the second portions on the frame.

10. The display device according to claim 9, wherein at least one of the first portions and the second portions is a magnet, and the first portions and the second portions are fixedly connected to each other by an attractive force between the magnet and the magnetically conductive material or between the magnet and the magnet.

11. The display device according to claim 9, wherein the material of the first portions is the magnetically conductive material and the material of the second portions is the magnetically conductive material, and the frame generates electromagnetic induction such that both the first portions and the second portions generate a magnetic force to fixedly connect the first portions to the second portions.

12. The display device according to claim 8, wherein the second portions are positioned above the first portions, and the second portions is provided with grooves that are defined at points where the second portions and the first portions are overlapped, such that bottom surfaces of the second portions and the first portions are flush on a same plane.

13. The display device according to claim 12, wherein thicknesses of the second portions are greater than thicknesses of the first portions.

14. The display device according to claim 8, wherein shapes of the first portions and the second portions are selected from the group consisting of an elongated shape, a zigzag shape, a wave shape, and a square-wave shape; and shapes of the open areas are selected from the group consisting of a rectangle, a diamond, and a circle.

* * * * *

UNITED STATES PATENT AND TRADEMARK OFFICE
CERTIFICATE OF CORRECTION

PATENT NO.        : 11,444,064 B2
APPLICATION NO.   : 16/620898
DATED             : September 13, 2022
INVENTOR(S)       : Guiyang Zhang It is certified that error appears in the above-identified patent and that said Letters Patent is hereby corrected as shown below:

On the Title Page

In item (73) Assignee:
"Wuhan China Star Optoelectronies Technology Co., Ltd."

Should be changed to:
--Wuhan China Star Optoelectronics Technology Co., Ltd.--

Signed and Sealed this
Twenty-first Day of February, 2023

*Katherine Kelly Vidal*

Katherine Kelly Vidal
*Director of the United States Patent and Trademark Office*